United States Patent
Hao

(10) Patent No.: US 10,777,118 B2
(45) Date of Patent: Sep. 15, 2020

(54) SHIFT REGISTER AND METHOD FOR DRIVING THE SAME, GATE DRIVING CIRCUIT AND DISPLAY DEVICE

(71) Applicant: BOE TECHNOLOGY GROUP CO., LTD., Beijing (CN)

(72) Inventor: Xueguang Hao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 253 days.

(21) Appl. No.: 15/749,975

(22) PCT Filed: Jul. 31, 2017

(86) PCT No.: PCT/CN2017/095289
§ 371 (c)(1),
(2) Date: Feb. 2, 2018

(87) PCT Pub. No.: WO2018/137326
PCT Pub. Date: Aug. 2, 2018

(65) Prior Publication Data
US 2019/0005867 A1    Jan. 3, 2019

(30) Foreign Application Priority Data

Jan. 24, 2017 (CN) .......................... 2017 1 0059304

(51) Int. Cl.
*G11C 19/00* (2006.01)
*G09G 3/20* (2006.01)
(Continued)

(52) U.S. Cl.
CPC ............. *G09G 3/2092* (2013.01); *G09G 3/20* (2013.01); *G09G 3/36* (2013.01); *G11C 19/28* (2013.01);
(Continued)

(58) Field of Classification Search
None
See application file for complete search history.

(56) References Cited

U.S. PATENT DOCUMENTS 9,466,254 B2   10/2016   Tan et al.
9,934,744 B2    4/2018   Huang
(Continued)

FOREIGN PATENT DOCUMENTS

CN    103714792 A     4/2014
CN    104282255    *   1/2015
(Continued)

OTHER PUBLICATIONS

International Search Report dated Oct. 31, 2017.

*Primary Examiner* — Tuan T Lam
(74) *Attorney, Agent, or Firm* — Dilworth & Barrese, LLP.; Michael J. Musella, Esq.

(57) ABSTRACT

A shift register and a method for driving the same, a gate driving circuit, and a display device, the shift register includes: a pull-up node control circuit allowing a potential of a pull-up node to become high according to a first input signal and a second input signal; a first capacitor coupled between a signal output terminal and the pull-up node of the shift register; a pull-down node control circuit controlling a potential of the pull-down node according to the second clock signal and the third clock signal and the potential of the pull-up node; an output circuit controlling an output of a gate driving signal at the signal output terminal; and a pull-down circuit allowing the potential of the pull-up node and a potential of the signal output terminal to become low.

13 Claims, 6 Drawing Sheets

(51) Int. Cl.
*G11C 19/28* (2006.01)
*G09G 3/36* (2006.01)
*G09G 3/3266* (2016.01)
*G09G 3/34* (2006.01)

(52) U.S. Cl.
CPC ......... *G11C 19/287* (2013.01); *G09G 3/3266* (2013.01); *G09G 3/3453* (2013.01); *G09G 3/3677* (2013.01); *G09G 2300/0408* (2013.01); *G09G 2310/0267* (2013.01); *G09G 2310/0286* (2013.01); *G09G 2310/08* (2013.01)

(56) References Cited

U.S. PATENT DOCUMENTS

| | | | | |
|---|---|---|---|---|
| 10,127,875 | B2 * | 11/2018 | Wu | G11C 19/28 |
| 2004/0140839 | A1 * | 7/2004 | Nagao | G11C 19/00 327/291 |
| 2013/0127807 | A1 | 5/2013 | Kim et al. | |
| 2016/0086562 | A1 * | 3/2016 | Tan | G09G 3/3677 345/215 |
| 2016/0293092 | A1 * | 10/2016 | Li | G09G 3/2092 |
| 2016/0365054 | A1 | 12/2016 | Wu et al. | |
| 2017/0018243 | A1 | 1/2017 | Huang et al. | |
| 2017/0061922 | A1 * | 3/2017 | Wang | G11C 19/184 |
| 2017/0092172 | A1 * | 3/2017 | Wang | G09G 3/20 |
| 2017/0092212 | A1 * | 3/2017 | Wang | G09G 3/20 |
| 2017/0124969 | A1 * | 5/2017 | Dai | G09G 3/3648 |
| 2017/0162148 | A1 * | 6/2017 | Xiao | G02F 1/1362 |
| 2017/0236480 | A1 * | 8/2017 | Dai | G09G 3/3677 345/213 |
| 2017/0323605 | A1 * | 11/2017 | Xiao | G09G 3/36 |
| 2018/0047751 | A1 * | 2/2018 | Xiao | H01L 27/124 |
| 2018/0068628 | A1 * | 3/2018 | Xiao | G09G 3/3648 |
| 2018/0190181 | A1 * | 7/2018 | Zhao | G09G 3/20 |
| 2018/0231818 | A1 * | 8/2018 | Cao | G09G 3/36 |
| 2019/0013083 | A1 * | 1/2019 | Wang | G09G 3/36 |

FOREIGN PATENT DOCUMENTS

| | | | |
|---|---|---|---|
| CN | 104282255 | A | 1/2015 |
| CN | 104299583 | A | 1/2015 |
| CN | 104318886 | * | 1/2015 |
| CN | 104575430 | A | 4/2015 |
| CN | 104700803 | A | 6/2015 |
| CN | 104778928 | A | 7/2015 |

* cited by examiner

SHIFT REGISTER AND METHOD FOR DRIVING THE SAME, GATE DRIVING CIRCUIT AND DISPLAY DEVICE

TECHNICAL FIELD

The present disclosure relates to a shift register and a method for driving the same, a gate driving circuit including the shift register, and a display device.

BACKGROUND

With the continuous development of the display technology, more and more display devices adopt a GOA (Gate on Array) technology, that is, a gate driving circuit is formed on an array substrate of a display device by an array process. The GOA technology can save costs and achieve symmetrical attractive design on both sides of the display panel, and the bonding area of the gate driving circuit and the fan-out wiring space can be simultaneously omitted, so that the design of narrow bezel can be realized. In addition, the GOA technology can also save the bonding process in the gate scanning line direction to provide production capacity and yield.

In the shift register in each stage in an N-type bidirectional scanning GOA circuit, one terminal of the capacitor of the pull-up node is usually coupled to a low potential, so that in the period of outputting a gate signal, the bootstrap function of the capacitor becomes invalid, so that the potential of the pull-up node cannot ensure that the output transistor can be fully turned on. For example, the threshold voltage of the output transistor drifts in the high and low temperature reliability testing process. In such a case, the potential of the pull-up node cannot be maintained high, causing the output of the gate driving signal to be abnormal, thereby causing the display operation of the display panel to be defective or abnormal.

SUMMARY

According to an aspect of the present disclosure, there is provided a shift register comprising: a pull-up node control circuit, configured to allow a potential of a pull-up node inside the shift register to become high according to a first input signal and a second input signal respectively received via a first signal input terminal and a second signal input terminal of the shift register; a first capacitor, coupled between a signal output terminal of the shift register and the pull-up node; a pull-down node control circuit, configured to control a potential of a pull-down node according to a second clock signal and a third clock signal respectively via a second clock signal terminal and a third clock signal terminal of the shift register and a potential of the pull-up node; an output circuit, configured to control an output of a gate electrode driving signal at a signal output terminal according to the potential of the pull-up node and a first clock signal received via a first clock signal terminal of the shift register; and a pull-down circuit, configured to allow the potential of the pull-up node and a potential of the signal output terminal to become low according to a potential of the pull-down node.

For example, the shift register may further comprise a second capacitor, coupled between a low potential terminal of the shift register and the pull-down node.

For example, the pull-up node control circuit may comprise: a first transistor, a control electrode of the first transistor being coupled to the first signal input terminal, a first electrode of the first transistor being coupled to a first reference potential terminal of the shift register, and the second electrode of the first transistor being coupled to the pull-up node; and a second transistor, a control electrode of the second transistor being coupled to the second signal input terminal, a first electrode of the second transistor being coupled to a second reference potential terminal of the shift register, and a second electrode of the second transistor being coupled to the pull-up node.

For example, the pull-down node control circuit may comprise: a third transistor, a control electrode of the third transistor being coupled to the first reference potential terminal of the shift register, and a first electrode of the third transistor being coupled to the second clock signal terminal; a fourth transistor, a control electrode of the fourth transistor being coupled to the second reference potential terminal of the shift register, and a first electrode of the fourth transistor being coupled to the third clock signal terminal; a fifth transistor, a control electrode of the fifth transistor being coupled to a second electrode of the third transistor and a second electrode of the fourth transistor, a first electrode of the fifth transistor being coupled to a high potential terminal of the shift register, and a second electrode of the fifth transistor being coupled to the pull-down node; and a sixth transistor, a control electrode of the sixth transistor being coupled to the pull-up node, a first electrode of the sixth transistor being coupled to the pull-down node, and a second electrode of the sixth transistor being coupled to the low potential terminal.

For example, the output circuit may comprise: a seventh transistor, a control electrode of the seventh transistor being coupled to the pull-up node, a first electrode of the seventh transistor being coupled to the first clock signal terminal, and a second electrode of the seventh transistor being coupled to the signal output terminal.

For example, the output circuit further comprises: an eighth transistor, a control electrode of the eighth transistor being coupled to the high potential terminal of the shift register, a first electrode of the eighth transistor being coupled to the pull-up node, and a second electrode of the eighth transistor being coupled to the control electrode of the eighth transistor.

For example, the pull-down circuit may comprise: a ninth transistor, a control electrode of the ninth transistor being coupled to the pull-down node, a first electrode of the ninth transistor being coupled to the low potential terminal, and a second electrode of the ninth transistor being coupled to the pull-up node; a tenth transistor, a control electrode of the tenth transistor being coupled to the pull-down node, a first electrode of the tenth transistor being coupled to the low potential terminal, and a second electrode of the tenth transistor being coupled to the signal output terminal.

For example, all the transistors are N-type transistors.

According to another aspect of the present disclosure, there is provided a gate driving circuit comprising a plurality of cascaded shift registers of any one of the above, wherein, a first signal input terminal of a shift register in each stage except a last stage is coupled to a signal output terminal of a shift register in a next stage, and a second signal input terminal of a shift register in each stage except a first stage is coupled to a signal output terminal of a shift register in a previous stage.

According to another aspect of the present disclosure, there is provided a display device, comprising the gate driving circuit according to the above.

According to another aspect of the present disclosure, there is provided a driving method for driving any one of the above shift registers. The driving method comprising: receiving the first input signal to allow the potential of the pull-up node to become high and charge the first capacitor; receiving the first clock signal to further pull up the potential of the pull-up node through the first capacitor, and simultaneously outputting the gate driving signal at the signal output terminal; receiving the second clock signal and the second input signal to allow the potential of the pull-up node and the potential of the signal output terminal become low; and maintaining the pull-down node at a high potential.

In the driving method, the first reference potential terminal and the second reference potential terminal of the shift register are respectively set to be high and low in a reverse scanning process; and the first reference potential terminal and the second reference potential terminal are respectively set to be low and high in a forward scanning process.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the following, a shift register and a method of driving the same, a gate driving circuit, and a display device according to the present disclosure are described with reference to the drawings and in conjunction with the embodiments.

The embodiments of the present disclosure provide a shift register and a method of driving the same, a gate driving circuit including the shift register, and a display device to ensure that the bootstrap function of the capacitance of the pull-up node is always valid during the gate signal output stage, so as to ensure that the potential of the pull-up node is maintained high in the gate signal output stage so that the output transistor is sufficiently turned on in the gate signal output stage. Thereby, it can be ensured that the gate drive signal is output normally, and it is further ensured that the display screen display normally.

Figure 1:
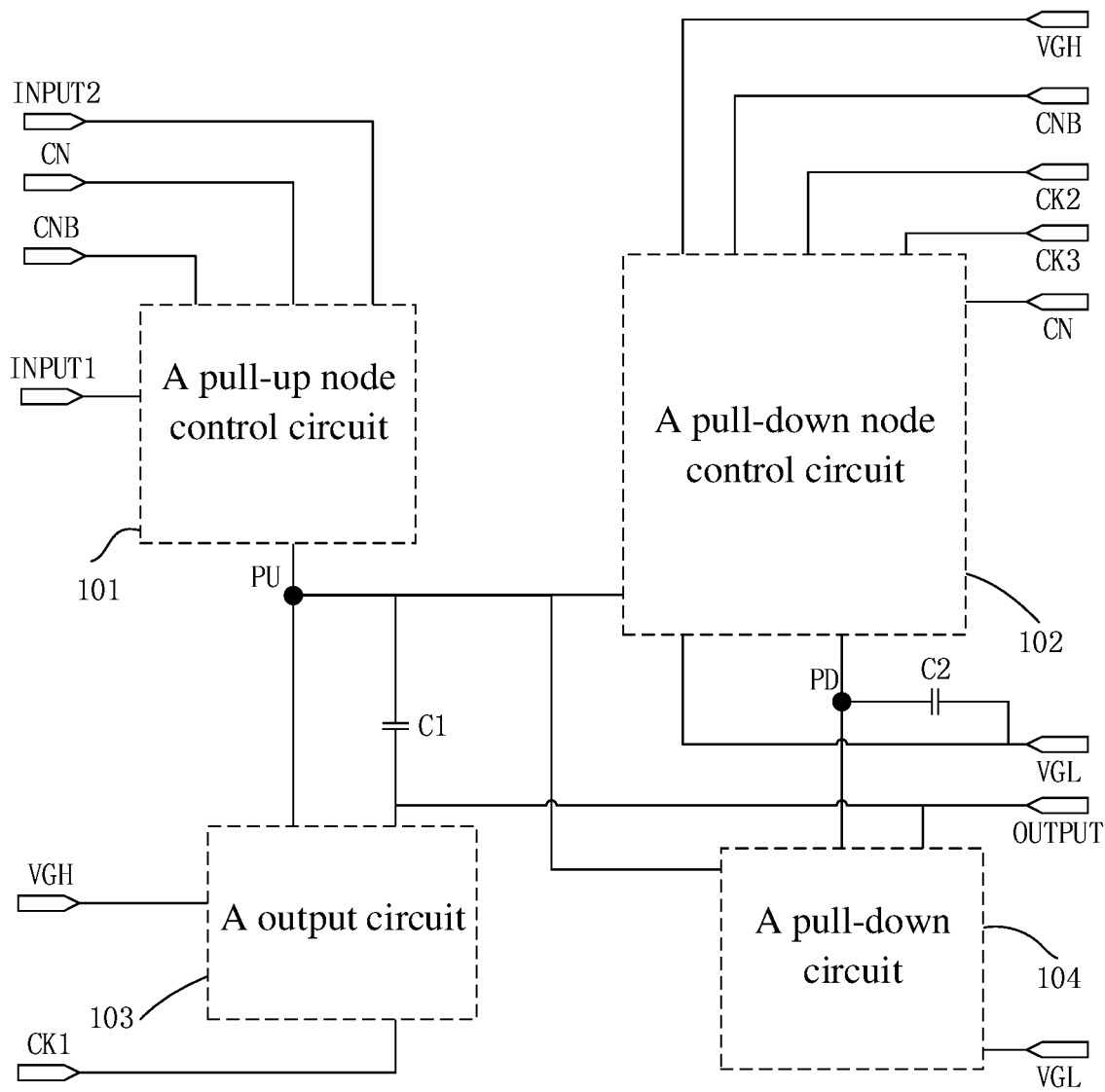
FIG. 1 shows a circuit included in a shift register according to an embodiment of the present disclosure.

As shown in FIG. 1, a shift register according to an embodiment of the present disclosure may be provided with a first signal input terminal INPUT1 for receiving a first input signal, a second signal input terminal INPUT2 for receiving a second input signal, a second clock signal terminal CK2 for receiving a second clock signal, a third clock signal terminal CK3 for receiving a third clock signal, a first clock signal terminal CK1 for receiving a first clock signal, a first reference potential terminal CNB for setting a first reference potential, a second reference potential terminal CN for setting a second reference potential, a signal output terminal OUTPUT for outputting a gate driving signal, a high potential terminal VGH, and a low potential terminal VGL. In the shift register, there are provided a pull-up node PU and a pull-down node PD, and may include a pull-up node control circuit 101, a capacitor C1, a pull-down node control circuit 102, an output circuit 103 and a pull-down circuit 104.

The pull-up node control circuit 101 may be provided with a first control terminal, a second control terminal, a first input terminal, a second input terminal, and an output terminal. For example, when the potential of the first control terminal is high, the first input terminal is coupled to the output terminal such that the potential of the output terminal becomes the same as the potential of the first input terminal. For example, when the potential of the second control terminal is high, the second input terminal is coupled to the output terminal so that the potential of the output terminal becomes the same as the potential of the second input terminal.

In the example as shown in FIG. 1, the first control terminal, the second control terminal, the first input terminal, the second input terminal and the output terminal of the pull-up node control circuit 101 may be respectively coupled to the first signal input terminal INPUT1, the second signal input terminal INPUT2, the first reference potential CNB, the second reference potential terminal CN and the pull-up node PU of the shift register. In this example, when the shift register receives the first input signal via the first signal input terminal INPUT1, the potential of the pull-up node PU may become the same as the potential of the first reference potential CNB; and when the shift register receives the second input signal via the second signal input terminal INPUT2, the potential of the pull-up node PU may become the same as the potential of the second reference potential CN. Accordingly, for example, the potential of the pull-up node PU can be set to be high according to the received first input signal and second input signal by the pull-up node control circuit 101.

In the example of FIG. 1, one terminal of the capacitor C1 is coupled to the pull-up node PU and the other terminal of the capacitor C1 is coupled to the signal output terminal OUTPUT.

The pull-down node control circuit 102 may be provided with a first control selection terminal, a second control selection terminal, a first control terminal, a second control terminal, a third control terminal, a first input terminal, a second input terminal, and an output terminal. For example, when the potential of the first control selection terminal is high, the connection and disconnection between the first input terminal and the output terminal is controlled according to the selected potential of the first control terminal, the first input terminal and the output terminal are in disconnection when the potential of the potential of the first control terminal is low while in connection when the potential of the potential of the first control terminal is high, so that the potential of the output terminal becomes the same as the potential of the first input terminal. For example, when the potential of the second control selection terminal is high, the connection and disconnection between the first input terminal and the output terminal is controlled according to the selected potential of the second control terminal, the first input terminal and the output terminal are in disconnection when the potential of the potential of the second control terminal is low while in connection when the potential of the potential of the second control terminal is high, so that the potential of the output terminal becomes the same as the potential of the first input terminal. The second input terminal and the output terminal are coupled when the potential of the third control terminal is high, so that the potential of the output terminal becomes the same as the potential of the second input terminal.

In the example of FIG. 1, the first control select terminal, the second control select terminal, the first control terminal, the second control terminal, the third control terminal, the first input terminal, the second input terminal and the output terminal of the pull-down node control circuit 102 may be respectively coupled to the first reference potential CNB, the second reference potential terminal CN, the second clock signal terminal CK2, the third clock signal terminal CK3, the pull-up node PU, the high potential terminal VGH, the low potential terminal VGL and pull-down node PD of the shift register. In this example, when the potential of the first reference potential CNB is high, the connection and disconnection between the high potential terminal VGH and the pull-down node PD is controlled according to the selected second clock signal received via the second clock signal terminal CK2, wherein, the high potential terminal VGH is coupled to the pull-down node PD when the second clock signal is received, so that the potential of the pull-down node PD becomes high; when the potential of the second reference potential CN is high, the connection and disconnection between the high potential terminal VGH and the pull-down node PD is controlled according to the selected third clock signal received via the third clock signal terminal CK3, and the high potential terminal VGH is coupled to the pull-down node PD when the third clock signal is received so that the potential of the pull-down node PD becomes high. In addition, when the potential of the pull-up node PU is high, the pull-down node PD is coupled to the low potential terminal VGL such that the potential of the pull-down node PD becomes low. Thus, the potential of the pull-down node can be controlled according to the received second clock signal or third clock signal, or potential of the pull-up node by the pull-down node control circuit 102.

The output circuit 103 may be provided with a control terminal, an input terminal and an output terminal; for example, the input terminal is coupled to the output terminal when the potential of the control terminal is high so that the potential of the output terminal is the same as the potential of the input terminal.

In the example of FIG. 1, the control terminal, the input terminal and the output terminal of the output circuit 103 may be respectively coupled to the pull-up node PU, the first clock signal terminal CK1 and the signal output terminal OUTPUT of the shift register, such that when the pull-up node PU is high, the signal output terminal OUTPUT can output the gate driving signal according to the first clock signal received via the first clock signal terminal CK1. Thus, the output of the gate driving signal at the signal output terminal OUTPUT can be controlled according to the potential of the pull-up node PU and the first clock signal by the output circuit 103.

The pull-down circuit 104 may be provided with a control terminal, an input terminal, a first output terminal and a second output terminal, for example, when the potential of the first control terminal of the pull-down circuit 104 is high, the input terminal of the pull-down circuit 104 is coupled to the first output terminal and the input terminal of the pull-down circuit 104 is coupled to the second output terminal, so that the potential of the first output terminal and the potential of the second output terminal of the pull-down circuit 104 are the same as the potential of the input terminal.

In the example of FIG. 1, the control terminal, the input terminal, the first output terminal and the second output terminal of the pull-down circuit 104 may be respectively coupled to the pull-down node PD, the low potential terminal VGL, the pull-up node PU and the signal output terminal OUTPUT of the shift register, so that the potential of the pull-up node PU and the potential of the signal output terminal OUTPUT can become low when the potential of the pull-down node PD is high.

As shown in FIG. 1, the shift register according to the embodiment of the present disclosure may further include a capacitor C2. In the example of FIG. 1, one terminal of the capacitor C2 is coupled to the pull-down node PD and the other terminal is coupled to the low potential terminal VGL of the shift register.

Figure 2:
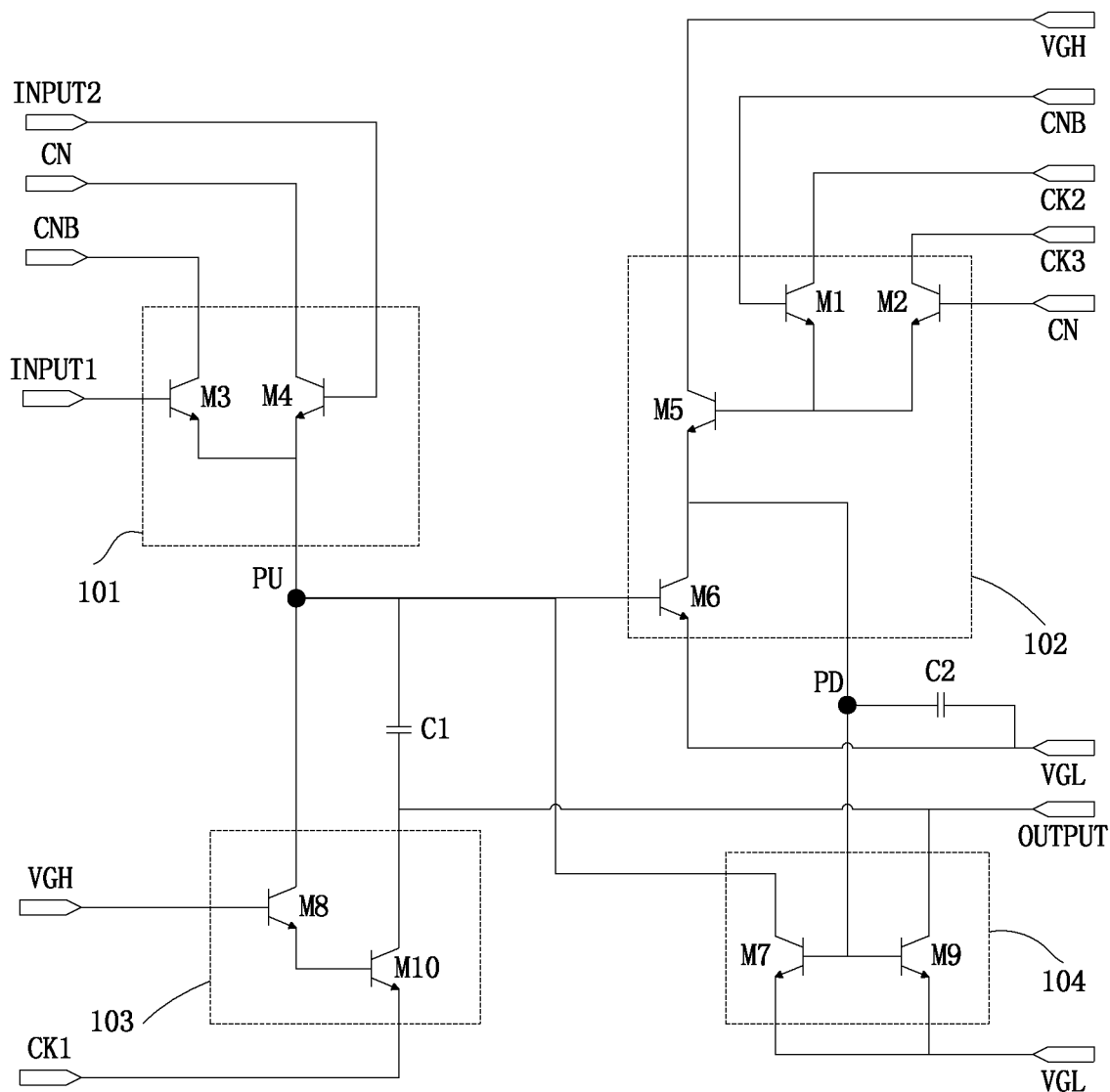
FIG. 2 shows an exemplary implementation of a circuit included in a shift register according to an embodiment of the disclosure.

FIG. 2 illustrates an exemplary implementation of various circuits included in the shift register according to the embodiment of the present disclosure as shown in FIG. 1.

In the example of FIG. 2, the pull-up node control circuit 101 may include a transistor M3 and a transistor M4. A control electrode of the transistor M3 can be used as the first control terminal of the pull-up node control circuit 101 and coupled to the first signal input terminal INPUT1 of the shift register, and a first electrode of the transistor M3 can be used as the first input terminal of the pull-up node control circuit

101 and coupled to the first reference signal terminal CNB of the shift register. A control electrode of the transistor M4 can be used as the second control terminal of the pull-up node control circuit 101 and coupled to the second signal input terminal INPUT2 of the shift register, and a first electrode of the transistor M4 can be used as the second input terminal of the pull-up node control circuit 101 and coupled to the first reference signal terminal CN of the shift register. A second electrode of the transistor M3 and a second electrode of the transistor M4 may be coupled together and also used as the output terminal of the pull-up node control circuit 101, and further coupled to the pull-up node PU. For example, transistor M3 and transistor M4 may be both N-type transistors such that each transistor can be turned on when the potential of the control electrode of each transistor is high.

In one embodiment, the pull-up node control circuit 101 may be implemented as an integrated circuit module. In another embodiment, the overall layout of the shift register circuit (for example, the exemplary circuit structure of the shift register as shown in FIG. 2) may also be considered, and the respective elements in the pull-up node control circuit 101 are respectively disposed at different positions of the shift register circuit while maintaining the connection among these elements so as to realize the corresponding functions of the pull-up node control circuit 101.

In the example of FIG. 2, the pull-down node control circuit 102 may include a transistor M1, a transistor M2, a transistor M5, and a transistor M6. A control electrode of the transistor M1 can be used as the first control selection terminal of the pull-down node control circuit 102 and coupled to the first reference potential CNB of the shift register, and a first electrode of the transistor M1 can be used as the first control terminal of the pull-down node control circuit 102 and coupled to the second clock signal terminal CK2 of the shift register. A control electrode of the transistor M2 can be used as the second control select terminal of the pull-down node control circuit 102 and coupled to the second reference potential CN of the shift register, and a first electrode of the transistor M2 can be used as the second control terminal of the pull-down node control circuit 102 and coupled to the third clock signal terminal CK3 of the shift register. A first electrode of the transistor M5 can be used as the first input terminal of the pull-down node control circuit 102 and coupled to the high potential terminal VGH of the shift register, and a second electrode of the transistor M5 can be used as the output terminal of the pull-down node control circuit 102 and coupled to the pull-down node PD of the shift register. A second electrode of the transistor M1 and a second electrode of the transistor M2 may be coupled together and both are coupled to a control electrode of the transistor M5, so that the turning-on and -off states of the transistor M5 can be controlled according to the second clock signal or the third clock signal. A control electrode of the transistor M6 can be used as the third control terminal of the pull-down node control circuit 102 and coupled to the pull-up node PU, and a second electrode of the transistor M6 can be used as the second input terminal of the pull-down node control circuit 102 and coupled to the low potential terminal VGL of the shift register, and a first electrode of the transistor M6 may be coupled to the second electrode of transistor M5 (i.e., as the output terminal of the pull-down node control circuit 102) and further coupled to pull-down node PD. Transistors M5 and M6 in different sizes may be provided as needed in order to control the potential of the pull-down node PD when both the transistors M5 and M6 are turned on. For example, if the potential of the pull-down node PD is to be low when both the transistors M5 and M6 are turned on, transistors M5 and M6 in different sizes can be selected so that the on-resistance of the transistor M6 is much smaller than the on-resistance of the transistor M5; if the potential of the pull-down node PD is to be high when both the transistors M5 and M6 are turned on, transistors M5 and M6 in different sizes can be selected so that the on-resistance of the transistor M6 is much bigger than the on-resistance of the transistor M5. For example, the transistor M1, the transistor M2, the transistor M5 and the transistor M6 may all be N-type transistors, so that the transistors are turned on when the potentials of the control electrodes thereof are high. It should be appreciated that the pull-down node control circuit 102 may also be implemented by other implementations.

In one embodiment, the pull-down node control circuit 102 may be implemented as an integrated circuit module. In other embodiments, the overall layout of the shift register circuit (for example, the exemplary circuit structure of the shift register shown in FIG. 2) may also be considered, and the respective elements in the pull-down node control circuit 102 are respectively disposed at different positions of the shift register circuit while maintaining the connection among these elements so as to realize the corresponding functions of the pull-down node control circuit 102.

In the example of FIG. 2, the output circuit 103 may include a transistor M10, and a control electrode, a first electrode and a second electrode of the transistor M10 may respectively be served as the control terminal, the input terminal and the output terminal of the output circuit 103. For example, the transistor M10 may be an N-type transistor, so the transistor is turned on when the potential of its control electrode is high. It should be appreciated that the output circuit 103 can also be implemented by other implementations. For example, as shown in FIG. 2, the output circuit 103 may further include a transistor M8. A control electrode of the transistor M8 may be coupled to the high potential terminal so that the transistor M8 is always turned on, a first electrode of the transistor M8 is coupled to the control terminal of the output circuit 103, and a second electrode of the transistor M8 is coupled to the control electrode of the transistor M10. The transistor M8 is provided so that the change of the voltage of the PU node does not directly affect the voltage of the gate electrode of the transistor M10 in the output circuit 103 so that the potential at the gate electrode of the transistor M10 is more stable to provide a more stable output. For example, the transistor M8 may also be an N-type transistor, so that the transistor is turned on when the potential of its control electrode is high.

In one embodiment, the output circuit 103 may be implemented as an integrated circuit module. In other embodiments, the overall layout of the shift register circuit (for example, the exemplary circuit structure of the shift register shown in FIG. 2) may also be considered, and the respective elements in the output circuit 103 are respectively disposed at different positions of the shift register circuit while maintaining the connection among these elements so as to realize the corresponding functions of the output circuit 103.

In the example of FIG. 2, the pull-down circuit 104 may include a transistor M7 and a transistor M9. A control electrode of the transistor M7 and a control electrode of the transistor M9 may be coupled together as the control terminal of the pull-down circuit 104 and further coupled to the pull-down node PD. A first electrode of the transistor M7 and a first electrode of the transistor M9 may be coupled together as an input terminal of the pull-down circuit 104 and further coupled to the low potential terminal VGL. A second electrode of the transistor M7 can be used as the first output of the pull-down circuit 104 and coupled to the pull-up node PU, and a second electrode of the transistor M9 can be served as the second output of the pull-down circuit 104 and coupled to the signal output terminal OUTPUT_N of the shift register. For example, the transistor M7 and the transistor M9 may be both N-type transistors such that each transistor is turned on when the potential of its control electrode is high. It should be understood that the pull-down circuit 104 can also be implemented by other implementations.

In one embodiment, the pull-down circuit 104 may be implemented as an integrated circuit module. In other embodiments, the overall layout of the shift register circuit (for example, the exemplary circuit structure of the shift register shown in FIG. 2) may also be considered, and the respective elements in the pull-down circuit 104 are respectively disposed at different positions of the shift register circuit while maintaining the connection among these elements so as to realize the corresponding functions of the pull-down circuit 104.

As for each transistor, the control electrode of the transistor may be the gate electrode of the transistor, the first electrode of the transistor may be one of the source electrode and the drain electrode of the transistor, the second electrode may be the other one of the source electrode and the drain electrode of the transistor. For example, the first electrode of the transistor M1 may be the source electrode of the transistor M1, the second electrode of the transistor M1 may be the drain electrode of the transistor M1, and the first electrode of the transistor M7 may be the drain electrode of the transistor M7 and the second electrode may be the source electrode of the transistor M7. Generally, the first electrode and the second electrode of a transistor are used interchangeably, and no distinction is made between these electrodes.

The shift register according to an embodiment of the present disclosure can realize bidirectional scanning. The first reference potential terminal CNB and the second reference potential terminal CN of the shift register can be respectively set to be high and low in a reverse scanning process. The first reference potential terminal CNB and the second reference potential terminal CN can be respectively set to be low and high in a forward scanning process.

Figure 3:
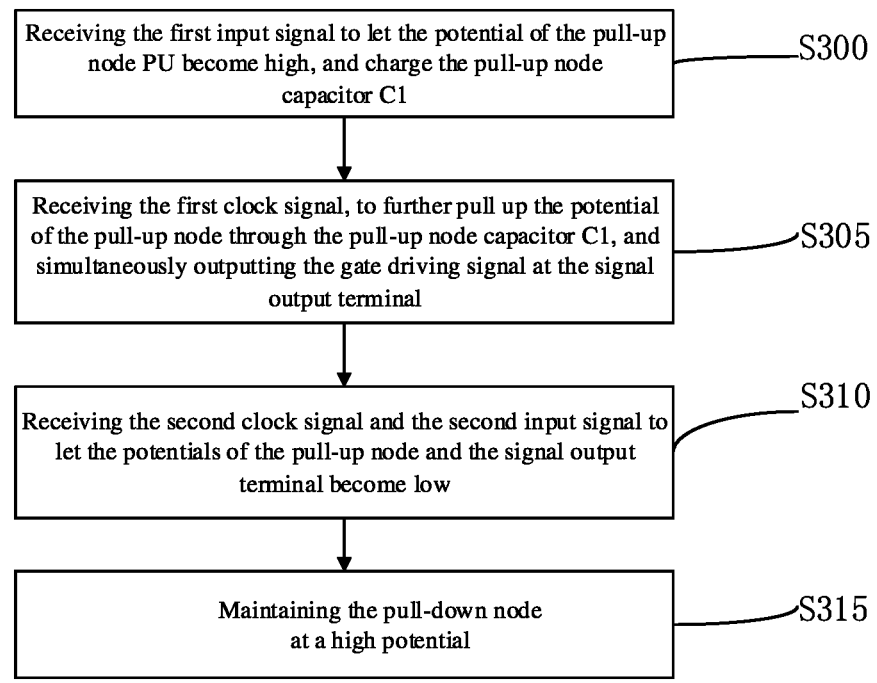
FIG. 3 shows a driving method of a shift register according to an embodiment of the present disclosure.

FIG. 3 illustrates a driving method of a shift register in a reverse scanning process according to an embodiment of the present disclosure, which includes steps 300, 305, 310, and 315.

In step S300, the pull-up node control circuit 101 receives the first input signal via the first signal input terminal INPUT1 of the shift register, and renders the potential of the pull-up node PU to become high and to charge the capacitor C1. This step may correspond to the input stage of the shift register.

In step S305, the output circuit 103 receives the first clock signal via the first clock signal terminal CK1 of the shift register. During this period, the capacitor C1 continues to raise the potential of the pull-up node PU by the bootstrap function to ensure that the transistor M10 of the output circuit 103 is fully turned on to output the gate driving signal at the signal output terminal OUTPUT of the shift register. This step may correspond to the output stage of the shift register.

In step S310, the pull-down node control circuit 102 receives the second clock signal and the second input signal via the second clock signal terminal CK2 and the second signal input terminal INPUT2 of the shift register so that the potential of the pull-down node PD becomes high, and the potential of the pull-up node PU and the potential of the signal output terminal OUTPUT become low. This step may correspond to the reset stage of the shift register.

In step S315, the potential of the pull-down node PD is maintained high until the next first input signal is received. This step may correspond to the holding stage of the shift register.

The potential of the first reference potential terminal CNB and the potential of the second reference potential terminal CN are respectively set to be low and high in a forward scanning process. In the input stage, the pull-up node control circuit 101 receives the second input signal via the second signal input terminal INPUT2 of the shift register. In the reset stage, the pull-down node control circuit 102 receives the third clock signal and the first input signal via the third clock signal terminal CK3 and the first signal input terminal INPUT1 of the shift register respectively. Other aspects are the same as those in the reverse scanning process and will not be repeated here.

Figure 4:
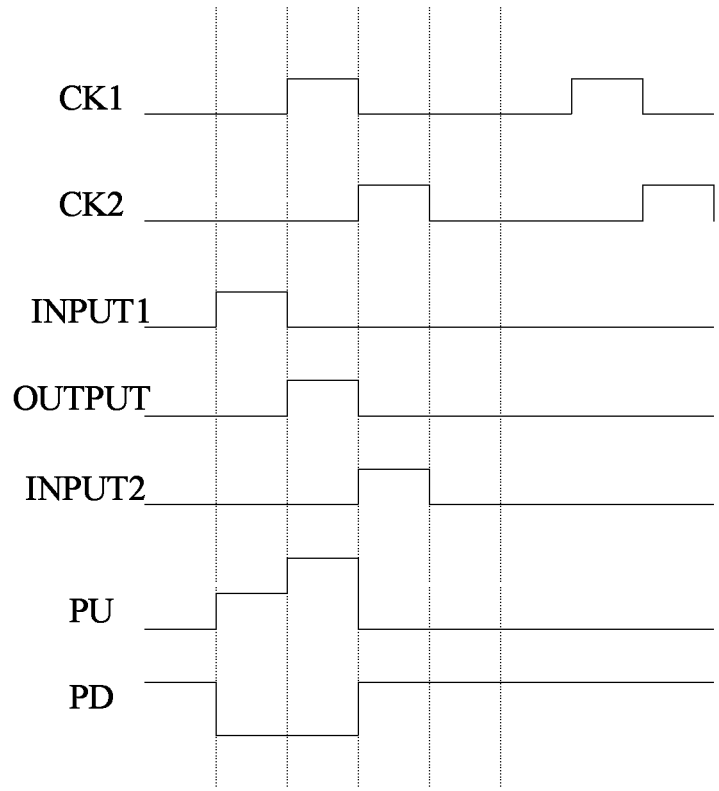
FIG. 4 shows one exemplary operation timing of a shift register according to an embodiment of the present disclosure.

FIG. 4 shows the operation timing of the shift register according to the embodiment of the present disclosure in the reverse scanning process as shown in FIG. 2.

The potential of the first reference potential terminal CNB is high and the potential of the second reference potential terminal CN is low in the reverse scanning process, so that the transistor M1 in the pull-down node control circuit 102 is always turned on and the transistor M2 is always turned off. Therefore, in the reverse scanning process, the third clock signal does not work.

In the input stage, the shift register receives the first input signal via the first signal input terminal INPUT1, and no signals are input to the second signal input terminal INPUT2, the second clock signal terminal CK2 and the first clock signal terminal CK1. The transistor M3 in the pull-up node control circuit 101 is turned on, so that the potential of the pull-up node PU is the same as the potential of the first reference potential terminal CNB, that is, becomes high. Capacitor C1 is charged. At this time, the second clock signal is not received, that is, the potential of the second clock signal terminal CK2 is low, so that the transistor M5 in the pull-down node control circuit 102 is turned off. At the same time, the transistor M6 in the pull-down node control circuit 102 is turned on because the potential of the pull-up node PU is high so that the potential of the pull-down node PD is the same as the potential of the low potential terminal VGL, that is, becomes low. In addition, the situation that the potential of the pull-up node PU becomes high also causes the transistor M10 in the output circuit 103 to be turned on. However, because the first clock signal CK1 is not received at this time, no gate drive signal is output at the signal output terminal OUTPUT.

In the output stage after the input stage, the shift register receives the first clock signal via the first clock signal terminal CK1, and no signals are input to the first signal input terminal INPUT1, the second signal input terminal INPUT2, and the second clock signal terminal CK2. The transistor M3 and the transistor M4 in the pull-up node control circuit 101 are both turned off. The potential of the pull-up node PU continues to rise due to the bootstrap function of the capacitor C1. The potential of the pull-down node PD continues to be held low due to the turning-on of the transistor M6 in the pull-down node control circuit 102. The transistor M10 in the output circuit 103 is turned on, and a gate driving signal is output at the signal output terminal OUTPUT due to the receipt of the first clock signal. In the output stage, the potential of the pull-up node PU continues to rise due to the bootstrap function of the capacitor C1.

Therefore, even if the threshold voltage of the transistor in the output circuit 103 is drifted, the potential of the pull-up node PU can also ensure that the transistors in the output circuit 103 are fully turned on so as to ensure the normal output of the gate driving signal.

In the reset stage after the output stage, the shift register receives the second input signal and the second clock signal via the second signal input terminal INPUT2 and the second clock signal terminal CK2 respectively, and no signals are input to the first signal input terminal INPUT1 and the first clock signal terminal CK1. The transistor M4 in the pull-up node control circuit 101 is turned on so that the potential of the pull-up node PU becomes the same as the potential of the second reference potential terminal CN, that is, becomes low, so that the transistor 10 in the output circuit 103 is turned off. The transistor M1 and the transistor M5 in the pull-down node control circuit 102 are turned on and the transistor M6 is turned off so that the potential of the pull-down node PD becomes the same as the potential of the high potential terminal VGH, that is, becomes high. Capacitor C2 starts to be charged. Because the potential of the pull-down node PD becomes high, the transistor M7 and the transistor M9 in the pull-down circuit 104 are turned on to respectively connect the pull-up node PU and the signal output terminal OUTPUT to the low potential terminal VGL, so that the potential of the pull-up node PU and the potential of the signal output terminal OUTPUT become low, so as to reset the potential of the pull-up node PU and the potential of the signal output terminal OUTPUT.

After the reset stage and before the next input stage, no signals are input to the first signal input INPUT1 and the second signal input INPUT2. When the second clock signal is received via the second clock signal terminal CK2, the transistor M5 in the pull-down node control circuit 102 is turned on so that the pull-down node PD is coupled to the high potential terminal VGH to hold its potential high, so that the transistor M7 and the transistor M9 of the pull-down circuit 104 are further turned on to keep the potential of the pull-up node PU and the potential of the signal output terminal OUTPUT be low. When the second clock signal is not received, the transistor M5 in the pull-down node control circuit 102 is turned off and the potential of the pull-down node PD is maintained high due to the bootstrap function of the capacitor C2, so that the transistor M7 and the transistor M9 in the pull-down circuit 104 are turned on to keep the potential of the pull-up node PU and the potential of the signal output terminal OUTPUT be low. Therefore, the potential of the pull-down node PD is always high before the next input stage, so as to ensure that the potential of the pull-up node PU and the potential of the signal output terminal OUTPUT are low, and noise is effectively avoided during the non-operating state.

Figure 5:
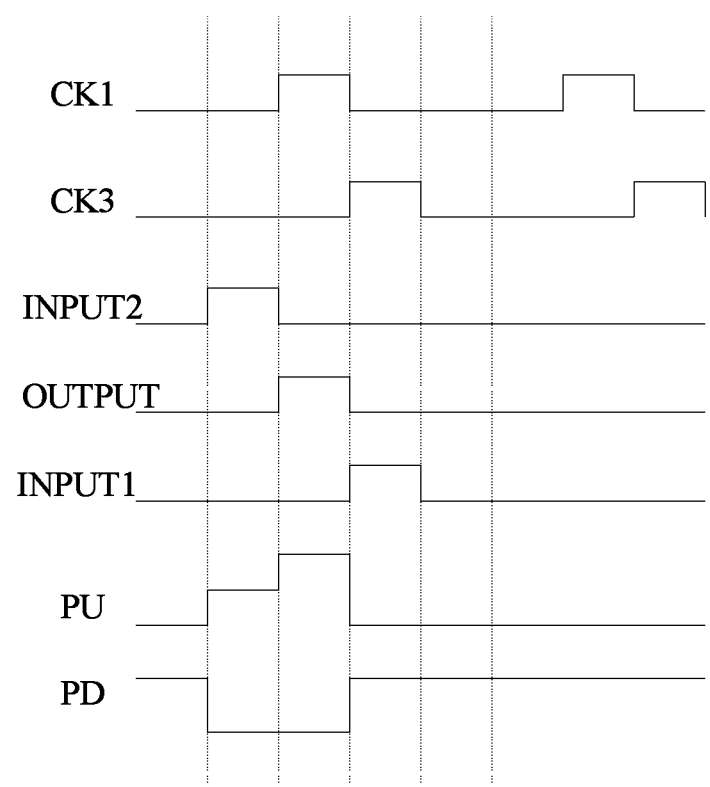
FIG. 5 shows another exemplary operation timing of a shift register according to an embodiment of the present disclosure.

In the forward scanning process, the potential of the first reference potential terminal CNB is low and the potential of the second reference potential terminal CN is high, so that the transistor M2 in the pull-down node control circuit 102 is always turned on and the transistor M1 is always turned off. Therefore, in the case of the forward scanning process, the second clock signal does not work. FIG. 5 shows the operation timing of a shift register according to an embodiment of the present disclosure in a forward scanning process, and this process is similar to that in the reverse scanning process and is not repeated here.

In one embodiment of the present disclosure, a plurality of the above-described shift registers can be cascaded together to form a gate driving circuit.

Figure 6:
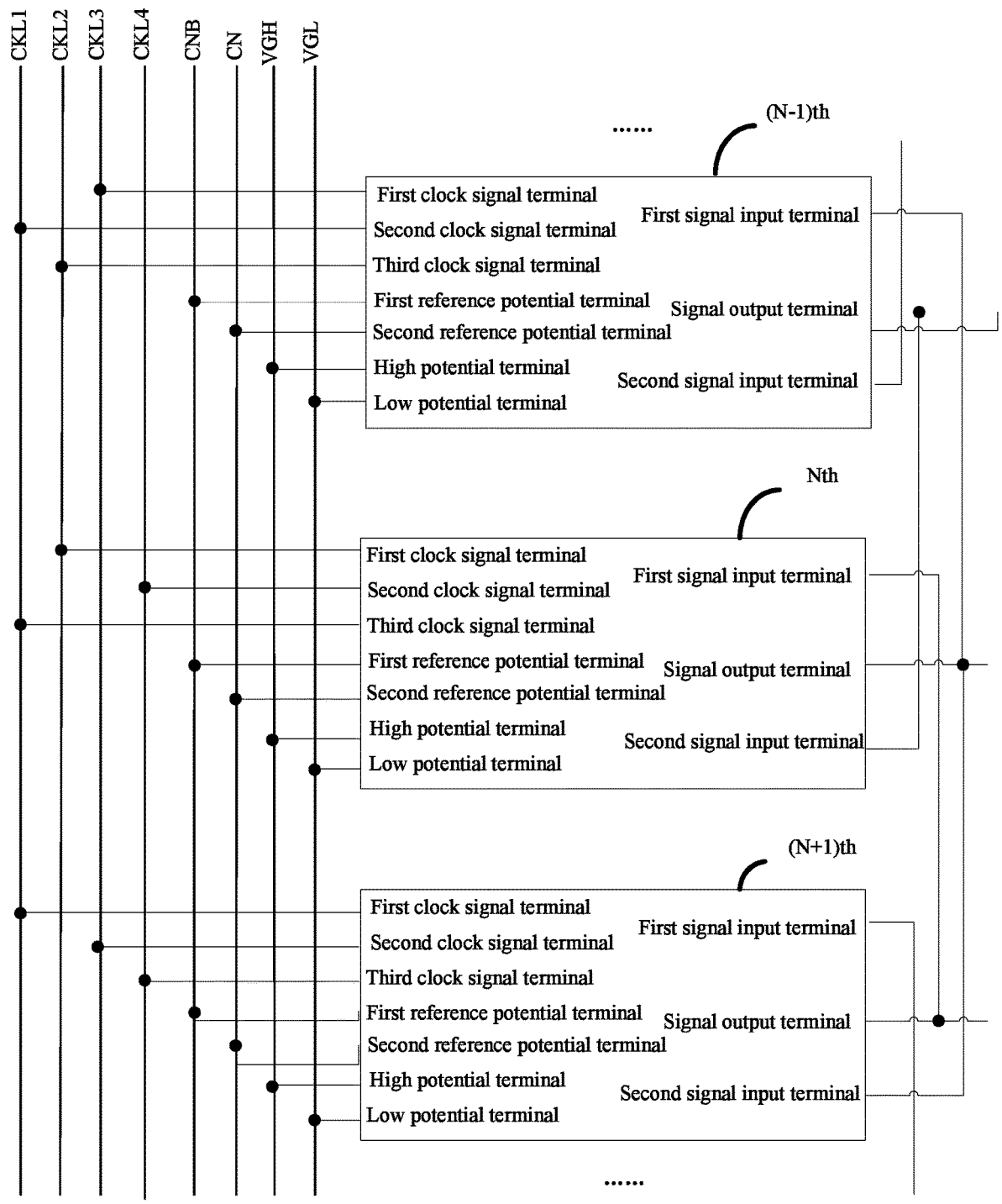
FIG. 6 shows a partial sectional view of a gate driving circuit according to an embodiment of the present disclosure.

FIG. 6 shows a partial schematic view of the gate driving circuit, showing the connection relationship among the adjacent three shift registers in the (N−1)th stage, the (N)th stage and the (N+1)th stage.

As shown in FIG. 6, a first signal input terminal of a shift register in each stage except the last stage may be coupled to a signal output terminal of a shift register in a next stage, and a second signal input terminal of a shift register in each stage except the first stage is coupled to a signal output terminal of a shift register in a previous stage.

Figure 7:
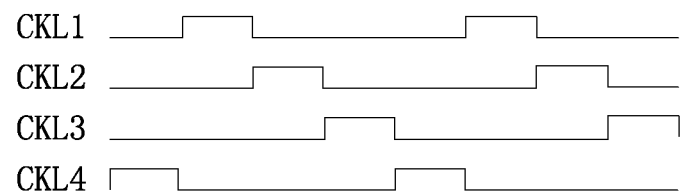
FIG. 7 shows a clock signal of a gate driving circuit in a reverse scanning process according to an embodiment of the present disclosure.
Figure 8:
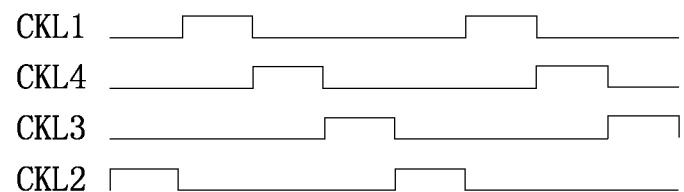
FIG. 8 shows a clock signal of the gate driving circuit in a forward scanning process according to an embodiment of the present disclosure.

Four clock signals can be respectively provided via the clock signal line CKL1, the clock signal line CKL2, the clock signal line CKL3, and the clock signal line CKL4. As shown in FIG. 6, the first clock signal terminal, the second clock signal terminal and the third clock signal terminal of the (N−1)th shift register can be respectively coupled to the clock signal lines CKL3, CKL1 and CKL2; the first clock signal terminal, the second clock signal terminal and the third clock signal terminal of the (N)th shift register may be respectively coupled to the clock signal lines CKL2, CKL4 and CKL1; the first clock signal terminal, the second clock signal terminal and the third clock signal terminal of the (N+1)th shift register may be respectively coupled to the clock signal lines CKL1, CKL3, and CKL4. The clock signals respectively provided via the clock signal line CKL1, the clock signal line CKL2, the clock signal line CKL3, and the clock signal line CKL4 in the reverse scanning process are shown in FIG. 7. The clock signals respectively provided via the clock signal line CKL1, the clock signal line CKL2, the clock signal line CKL3, and the clock signal line CKL4 in the forward scanning process are shown in FIG. 8.

Figure 9:
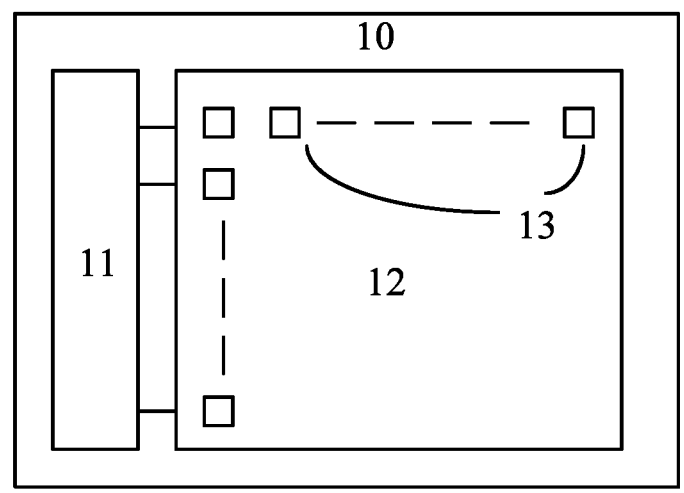
FIG. 9 shows a sectional view of a display device according to an embodiment of the present disclosure.

In addition, in another embodiment of the present disclosure, a display device is provided. As shown in FIG. 9, the display device 10 includes a gate driving circuit 11 according to any of the above embodiments and a pixel array 12, and the gate driving circuit 11 is used for providing gate scanning signals to the pixel units 13 in the pixel array 11.

An example of the display device is a liquid crystal display device, and an array substrate and a counter substrate are opposed to each other to form a liquid crystal cell in which a liquid crystal material is filled. The pixel electrode of each pixel unit of the array substrate is used for controlling the degree of rotation of the liquid crystal material by applying an electric field to perform a display operation. The gate driving circuit is formed on the array substrate.

Another example of the display device is an organic light emitting display (OLED). An array of organic light-emitting materials is formed on the array substrate and a pixel electrode of each pixel unit is used as an anode or a cathode for driving the organic light-emitting material to emit light for display operating. The gate driving circuit is formed on the array substrate.

Another example of the display device is an electronic paper display device, and an electronic ink layer is formed on an array substrate and a pixel electrode of each pixel unit is used as applying a voltage for driving charged microparticles in electronic ink to move to perform a display operation. The gate driving circuit is formed on the array substrate.

Such a display device may be a smart phone, a laptop, a tablet computer, a personal digital assistant (PDA), or any one of display devices using GOA technology.

The embodiments of the shift register and the method for driving the same, the gate driving circuit, and the display device according to the present disclosure have been described above. According to the shift register and the method for driving the same according to the embodiments of the present disclosure, it is possible to ensure that the bootstrap function of the capacitor is always valid during the gate signal output stage, so as to ensure that the potential of the pull-up node maintains to be high in the gate signal output stage so that the output transistor is sufficiently turned on in the gate signal output stage. Thereby, it can be ensured that the gate drive signal is output normally, and it can be further ensured that the display screen display normally. In addition, it can also prevent the gate driving circuit from introducing noise in a non-operating state.

What are described above is related to the illustrative embodiments of the disclosure only and not limitative to the scope of the disclosure; the scopes of the disclosure are defined by the accompanying claims.

The application claims priority to the Chinese patent application No. 201710059304.9, filed Jan. 24, 2017, the entire disclosure of which is incorporated herein by reference as part of the present application.

What is claimed is:

1. A shift register, comprising:
a pull-up node control circuit, comprising a first transistor and a second transistor, and configured to allow a potential of a pull-up node inside the shift register to be pulled up according to a first input signal and a second input signal respectively received via a first signal input terminal and a second signal input terminal of the shift register;
a first capacitor, coupled between a signal output terminal of the shift register and the pull-up node without intervening of any transistor;
a pull-down node control circuit, comprising a third transistor, a fourth transistor, a fifth transistor and a sixth transistor, and configured to control a potential of a pull-down node according to a second clock signal and a third clock signal respectively via a second clock signal terminal and a third clock signal terminal of the shift register and a potential of the pull-up node;
an output circuit, comprising a seventh transistor and an eighth transistor, and configured to control an output of a gate electrode driving signal at the signal output terminal according to the potential of the pull-up node and a first clock signal received via a first clock signal terminal of the shift register, wherein, a control electrode of the seventh transistor being coupled to the pull-up node, a first electrode of the seventh transistor being coupled to the first clock signal terminal, and a second electrode of the seventh transistor being coupled to the signal output terminal; wherein, a control electrode of the eighth transistor being coupled to a second potential terminal of the shift register, a first electrode of the eighth transistor being coupled to the pull-up node without intervening of any transistor, and a second electrode of the eighth transistor being coupled to the control electrode of the seventh transistor without intervening of any transistor; and
a pull-down circuit, comprising a ninth transistor and a tenth transistor, and configured to allow the potential of the pull-up node and the potential of the signal output terminal to be pulled down according to a potential of the pull-down node.

2. The shift register according to claim 1, further comprising:
a second capacitor, coupled between a first potential terminal of the shift register and the pull-down node.

3. The shift register according to claim 1, wherein:

a control electrode of the first transistor being coupled to the first signal input terminal, a first electrode of the first transistor being coupled to a first reference potential terminal of the shift register, and a second electrode of the first transistor being coupled to the pull-up node; and
a control electrode of the second transistor being coupled to the second signal input terminal, a first electrode of the second transistor being coupled to a second reference potential terminal of the shift register, and a second electrode of the second transistor being coupled to the pull-up node.

4. The shift register according to claim 3, wherein:
a control electrode of the third transistor being coupled to the first reference potential terminal of the shift register, and a first electrode of the third transistor being coupled to the second clock signal terminal;
a control electrode of the fourth transistor being coupled to the second reference potential terminal of the shift register, and a first electrode of the fourth transistor being coupled to the third clock signal terminal;
a control electrode of the fifth transistor being coupled to a second electrode of the third transistor and a second electrode of the fourth transistor, a first electrode of the fifth transistor being coupled to the second potential terminal of the shift register, and a second electrode of the fifth transistor being coupled to the pull-down node; and
a control electrode of the sixth transistor being coupled to the pull-up node, a first electrode of the sixth transistor being coupled to the pull-down node, and a second electrode of the sixth transistor being coupled to a first potential terminal, wherein a potential received by the first potential terminal is lower than a potential received by the second potential terminal.

5. The shift register according to claim 1, wherein:
a control electrode of the ninth transistor being coupled to the pull-down node, a first electrode of the ninth transistor being coupled to a first potential terminal, and a second electrode of the ninth transistor being coupled to the pull-up node;
a control electrode of the tenth transistor being coupled to the pull-down node, a first electrode of the tenth transistor being coupled to the first potential terminal, and a second electrode of the tenth transistor being coupled to the signal output terminal.

6. The shift register according to claim 3, wherein all the transistors are N-type transistors.

7. A gate driving circuit, comprising a plurality of cascaded shift registers according to claim 1, wherein
a first signal input terminal of a shift register in each stage except a last stage is coupled to a signal output terminal of a shift register in a next stage, and
a second signal input terminal of a shift register in each stage except a first stage is coupled to a signal output terminal of a shift register in a previous stage.

8. A display device, comprising the gate driving circuit according to claim 7.

9. A driving method for driving the shift register according to claim 1, comprising:
receiving the first input signal to allow the potential of the pull-up node to be pulled up and charge the first capacitor;
receiving the first clock signal to further pull up the potential of the pull-up node through the first capacitor, and simultaneously outputting the gate driving signal at the signal output terminal;

receiving the second clock signal and the second input signal to allow the potential of the pull-up node and the potential of the signal output terminal to be pulled down; and maintaining the pull-down node at a raised potential.

10. The driving method according to claim 9, wherein, a first reference potential terminal and a second reference potential terminal of the shift register are respectively set to be a second reference potential and a first reference potential in a reverse scanning process, and the first reference potential terminal and the second reference potential terminal are respectively set to be the second reference potential and the first reference potential in a forward scanning process, wherein the second reference potential is higher than the first reference potential.

11. The shift register according to claim 2, wherein:

a control electrode of the first transistor being coupled to the first signal input terminal, a first electrode of the first transistor being coupled to a first reference potential terminal of the shift register, and a second electrode of the first transistor being coupled to the pull-up node; and a control electrode of the second transistor being coupled to the second signal input terminal, a first electrode of the second transistor being coupled to a second reference potential terminal of the shift register, and a second electrode of the second transistor being coupled to the pull-up node.

12. The shift register according to claim 11, wherein:

a control electrode of the third transistor being coupled to the first reference potential terminal of the shift register, and a first electrode of the third transistor being coupled to the second clock signal terminal;

a control electrode of the fourth transistor being coupled to the second reference potential terminal of the shift register, and a first electrode of the fourth transistor being coupled to the third clock signal terminal;

a control electrode of the fifth transistor being coupled to a second electrode of the third transistor and a second electrode of the fourth transistor, a first electrode of the fifth transistor being coupled to the second potential terminal of the shift register, and a second electrode of the fifth transistor being coupled to the pull-down node; and a control electrode of the sixth transistor being coupled to the pull-up node, a first electrode of the sixth transistor being coupled to the pull-down node, and a second electrode of the sixth transistor being coupled to the first potential terminal.

13. The shift register according to claim 2, wherein:

a control electrode of the ninth transistor being coupled to the pull-down node, a first electrode of the ninth transistor being coupled to the first potential terminal, and a second electrode of the ninth transistor being coupled to the pull-up node;

a control electrode of the tenth transistor being coupled to the pull-down node, a first electrode of the tenth transistor being coupled to the first potential terminal, and a second electrode of the tenth transistor being coupled to the signal output terminal.

* * * * *